United States Patent
Fogleman

(10) Patent No.: US 8,816,762 B2
(45) Date of Patent: Aug. 26, 2014

(54) AREA-OPTIMIZED ANALOG FILTER WITH BANDWIDTH CONTROL BY A QUANTIZED SCALING FUNCTION

(75) Inventor: Eric Fogleman, Carlsbad, CA (US)

(73) Assignee: MaxLinear, Inc., Carlsbad, CA (US)

( * ) Notice: Subject to any disclaimer, the term of this patent is extended or adjusted under 35 U.S.C. 154(b) by 0 days.

(21) Appl. No.: 13/006,334

(22) Filed: Jan. 13, 2011

(65) Prior Publication Data

US 2012/0025904 A1    Feb. 2, 2012

Related U.S. Application Data

(60) Provisional application No. 61/294,781, filed on Jan. 13, 2010.

(51) Int. Cl.
*H03K 5/00* (2006.01)

(52) U.S. Cl.
USPC .......................................... 327/553; 327/552

(58) Field of Classification Search
USPC .................. 327/336–337, 551–559
See application file for complete search history.

(56) References Cited

U.S. PATENT DOCUMENTS

| | | | | |
|---|---|---|---|---|
| 6,366,161 B1 * | 4/2002 | Koazechi | ...................... | 327/553 |
| 6,424,209 B1 * | 7/2002 | Gorecki et al. | ................ | 327/554 |
| 7,425,863 B2 * | 9/2008 | Gatta et al. | ..................... | 327/558 |
| 7,848,725 B2 * | 12/2010 | Zolfaghari et al. | ........... | 455/260 |
| 2002/0186074 A1 | 12/2002 | Gorecki et al. | | |
| 2005/0118980 A1 | 6/2005 | Pai et al. | | |
| 2005/0242872 A1 | 11/2005 | Lou et al. | | |
| 2005/0248394 A1 | 11/2005 | Lou et al. | | |
| 2006/0114247 A1 * | 6/2006 | Brown | ......................... | 345/204 |
| 2008/0100374 A1 * | 5/2008 | Papananos et al. | ........... | 327/553 |

FOREIGN PATENT DOCUMENTS

WO    WO 2011/088246 A1    7/2011

OTHER PUBLICATIONS

International Search Report and Written Opinion for PCT Application No. PCT/US2011/021189, 12 pages.
International Preliminary Report on Patentability with Written Opinion for PCT Application No. PCT/US2011/021189, mailed Jul. 26, 2012; 8 pages.

* cited by examiner

Primary Examiner — Dinh T. Le
(74) Attorney, Agent, or Firm — Ardeshir Tabibi, Esq.; Kilpatrick Townsend & Stockton LLP

(57) ABSTRACT

A programmable active frequency-selective circuit includes a first capacitor having a fixed value and a second capacitor coupled in parallel to the first capacitor and having a plurality of switchable capacitors connected in parallel to each other. The programmable active frequency-selective circuit further includes a plurality of switches each being associated with one of the switchable capacitors, and a control port coupled to the switches. The capacitors may be varied to account for processing variations that occur during manufacturing of the programmable active frequency-selective circuit. The capacitors values may also be varied to change the bandwidth and/or gain of the programmable active frequency-selective circuit.

17 Claims, 10 Drawing Sheets

Fc = g (gain, bandwidth mode, process tuning)

AREA-OPTIMIZED ANALOG FILTER WITH BANDWIDTH CONTROL BY A QUANTIZED SCALING FUNCTION

CROSS-REFERENCES TO RELATED APPLICATIONS

The present application claims benefit under 35 USC 119 (e) of U.S. provisional application No. 61/294,781, filed Jan. 13, 2010, entitled "Area Optimized Analog Filter with Bandwidth Control by a Quantized Scaling Function," the content of which is incorporated herein by reference in its entirety.

BACKGROUND OF THE INVENTION

The present invention relates to mixed-signal circuits, and more particularly to programmable active filters that improves the bandwidth resolution, wherein the programmability can be performed either by the user or by the manufacturer by means of a look-up table.

In mixed-signal circuits, a common requirement is that the bandwidth of an analog frequency-selective filter be programmed to a desired value dependent on several variables, such as bandwidth mode and process correction factor. Furthermore, gain selection may affect time constants requiring a further correction.

When implementing integrated programmable active filters, processing and temperature variations can cause values of the components to vary, which in turn cause the circuit parameters such as the RC product to vary. One approach may use operational amplifiers having high-precision external resistors and capacitors. Another approach may use an integrated filter having an RC product that can be programmed to compensate for process and temperature variations.

FIG. 1A shows a schematic of a low-pass filter 10 whose cut-off frequency $f_c$ is shown as being dependent on the gain, bandwidth and processing parameters. FIG. 1B is a conventional implementation of low-pass filter 10. Low-pass filter 10 includes an operational amplifier (op-amp) 11 having a differential input x(t) and a differential output y(t). Op-amp 11 may be a gain circuit having two inverting feedback paths 12, 13. An inverting output is coupled to a non-inverting input of op-amp 11 via feedback path 12, and a non-inverting output is coupled to an inverting input of the op-amp via feedback path 13. In the example shown, the low-pass filter is a differential topology to reject common mode noise. It is appreciated that the filter can be converted to a single-ended topology by connecting either of the signal inputs to ground. In the following, only one feedback path will be described as the other feedback path has a mirror function and does not change the gain, the bandwidth mode and the process variation of the filter.

Feedback path 12 includes a resistor Rfa that together with input resistor Rp defines the gain of the low-pass filter. Feedback path 12 also includes a capacitor C1a that together with resistor Rfa defines the 3 dB cut-off frequency (i.e., the bandwidth) of the low-pass filter. By adjusting the value of resistor Rfa and/or capacitor C1a, the bandwidth of the low-pass filter can be controlled or corrected, e.g., to compensate for process and temperature variations or to adapt to application demands. In the example described above, the negative input is assumed to be connected to ground, so that the output y(t) is inverting. Similarly, the low-pass filter 10 can also be described as a single-ended low-pass filter having feedback path 13 interposed between the positive output and the negative input of the operational amplifier 11 and the positive input connected to ground. In this case, the gain of the low-pass filter is defined as the ration ratio of Rfb/Rn and the cut-off frequency is defined as fc=1/(2π*Rfb*C1b).

As shown in FIG. 1B, low-pass filter 10 can be tuned by using a tunable capacitor arrays and multiple resistors connected in series and/or in parallel. In general, the value of capacitance and resistance per unit area in integrated circuit manufacturing processes is not well controlled, and in order to have an appropriate bandwidth resolution, a large number of capacitors and consequently a large number of control bits are required. The large number of capacitors may require a large layout area and increase the cost of the programmable filters.

Accordingly, it is desirable to provide a user or manufacturer-programmable capacitor value using a small number of capacitor values and a small number of control bits for use in programmable filters.

BRIEF SUMMARY OF THE INVENTION

A specific embodiment of the present invention provides a programmable active frequency-selective circuit. The programmable active frequency-selective circuit includes a first capacitor having a fixed value and a second capacitor having a value defined by a product of a parameter and a plurality of switchable capacitors, wherein the parameter is defined by a gain, a bandwidth mode, and a process resolution. In an embodiment, the gain may be selected between 0 dB and −3 dB. In another embodiment the bandwidth may be selected between a 6 MHz mode and an 8 MHz mode. In yet another embodiment, the process resolution may be selected in steps of 5% between −5% to +5%.

The programmable active frequency-selective circuit further includes a first resistor having a fixed first value, a second resistor coupled in series with the first resistor, and a switch coupled across the second resistor, wherein the switch is controlled by the parameter to short-circuit the second resistor to set the gain. The programmable active frequency-selective circuit also includes multiple switches, each of the multiple switches corresponds to one of the plurality of switchable capacitors, and a control port coupled to each of the multiple switches. In addition, the programmable active frequency-selective circuit includes a memory for storing the parameter.

In another embodiment, a control circuit for selecting a bandwidth, a gain and adjusting a process variation of a resistor-capacitor (RC) filter includes a first resistor having a first value, a second resistor having a second value and being connected in series with the first resistor, and a third resistor having a third value. The control circuit further includes a fixed capacitor and a capacitor array coupled in parallel to the fixed capacitor and coupled in parallel to the third resistor, wherein the capacitor array contains multiple switchable capacitors and wherein the fixed capacitor and the capacitor array have a total capacitive value that defines the bandwidth of the RC filter, and wherein the total capacitive value is defined by a parameter, which, in turn, is defined by the bandwidth, the gain, and the process variation.

In an embodiment, the first, second, and third values of the respective first, second, and third resistors are fixed. In another embodiment, the second resistor may be shorted using a switch that is controlled by the parameter.

Although the present invention provides a programmable filter that uses a series resistor to enable a gain setting and a process tuning. One of ordinary skill in the art would recognize other variations, modifications, and alternatives. For example, the RC filter can be replaced with a gm-C (transconductance-Capacitor) filter.

BRIEF DESCRIPTION OF THE DRAWINGS

The present invention provides advantages that become obvious to those of ordinary skilled in the art after having read the following detailed description of the embodiments that are illustrated in the various figures, in which:

FIG. 7 shows a table illustrating an exact scaling of capacitance values as a function of bandwidth, gain, and process tuning and required capacitance values according to an embodiment of the present invention;

FIG. 9 shows a table illustrating a derivation of quantizing function and required capacitor sizes according to an embodiment of the present invention.

DETAILED DESCRIPTION OF THE INVENTION

In the following description, the circuit paths are described as being single-ended for brevity. Although single-ended operations are possible as described above, the preferred embodiments of the present invention are implemented with circuits operating in a fully differential mode. A differential operational mode provides many advantages over a single-ended operational mode such as larger dynamic range, better total harmonic distortion, higher common mode rejection, and immunity to power supply variations.

Although the exemplary implementation described above relates to a low-pass RC active filter, one of skilled in the art would appreciated that the implantation could be applied to band-pass and high-pass filters by changing the location of the capacitor in the feedback path.

Figure 1A:
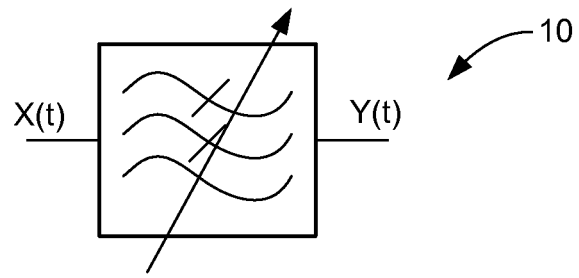
FIG. 1A is a block diagram of a programmable low-pass filter that can be used in embodiments of the present invention.
Figure 1B:
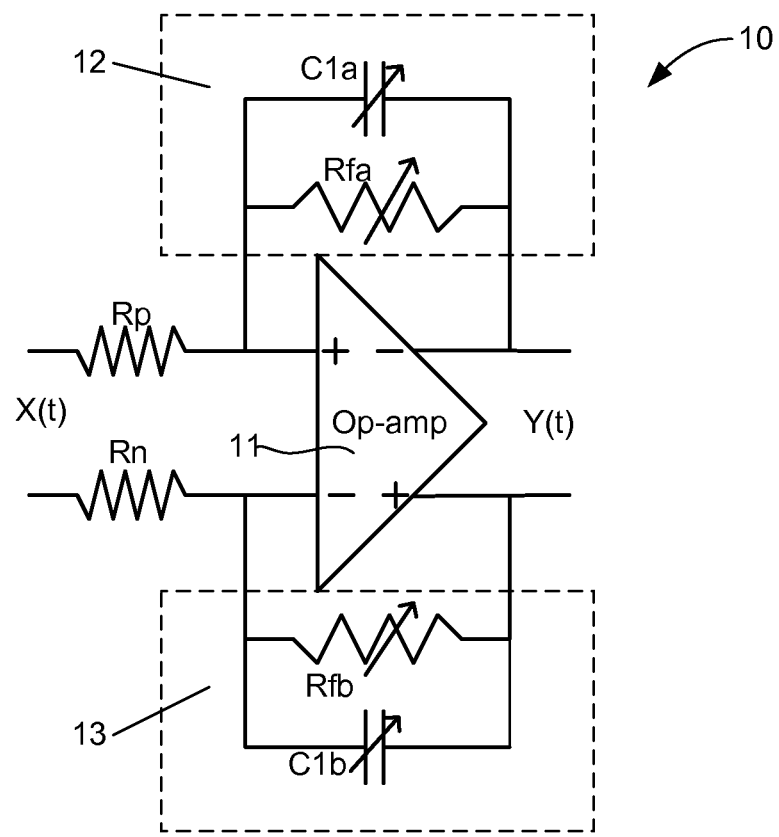
FIG. 1B is a conventional schematic circuit diagram of the programmable low-pass filter of FIG. 1A.
Figure 1C:
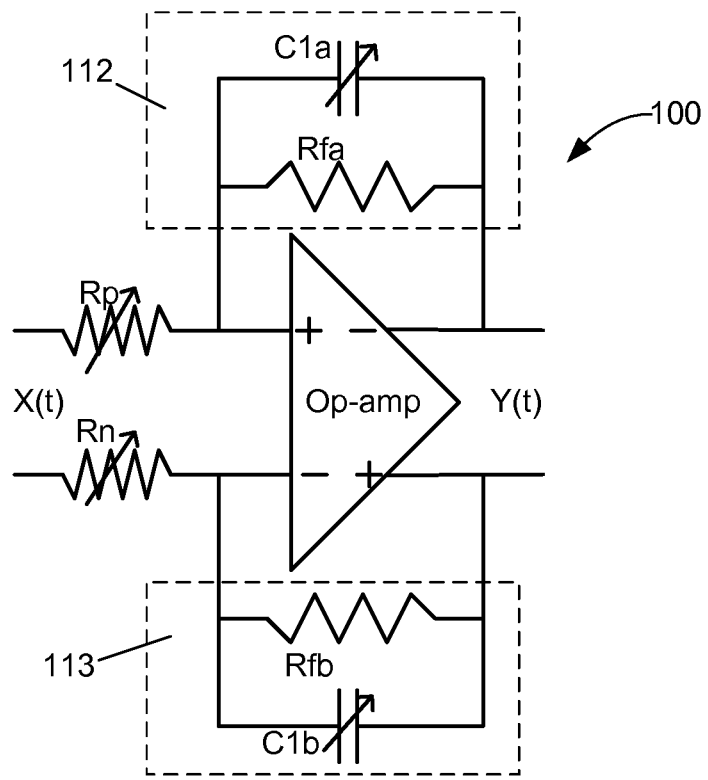
FIG. 1C is an alternative example schematic circuit diagram of the programmable low-pass filter of FIG. 1A according to an embodiment of the present invention.

FIG. 1C shows an example schematic diagram of an RC active low-pass filter 100 according to an embodiment of the present invention. This diagram is merely an example, which should not unduly limit the scope of the claims recited herein. One of ordinary skill in the art would recognize other variations, modifications, and alternatives. As shown, low-pass filter 100 includes an operational amplifier (Op-amp) having a positive input terminal and a negative input terminal configured to receive a differential input signal x(t) through the respective input resistors Rp and Rn. It is noted that the disclosure herein may apply to other types of filter topologies and realizations such as Sallen-Key, gm-C. As shown, low-pass filter 100 also includes a feedback path 112 that is coupled between a negative output terminal of the Op-amp and the positive input terminal. Low-pass filter 100 also includes a feedback path 113 that is coupled between a positive output terminal of the Op-amp and the negative input terminal. In an embodiment, feedback path 112 includes a capacitor C1a and a resistor Rfa, capacitor C1a together with resistor Rfa define the cut-off frequency (i.e., the bandwidth) of the low-pass filter. The ratio of resistor Rfa to resistor Rp determines the gain of the low-pass filter. Similarly, feedback path 113 includes a capacitor C1b and a resistor Rfb, the capacitor C1b together with the resistor Rfb define the cut-off frequency (i.e., the bandwidth) of the low-pass filter. The ratio of resistor Rfb to resistor Rn determines the gain of the low-pass filter. For the sake of brevity, circuits in the following sections are described using a single-ended operational mode.

Figure 2:
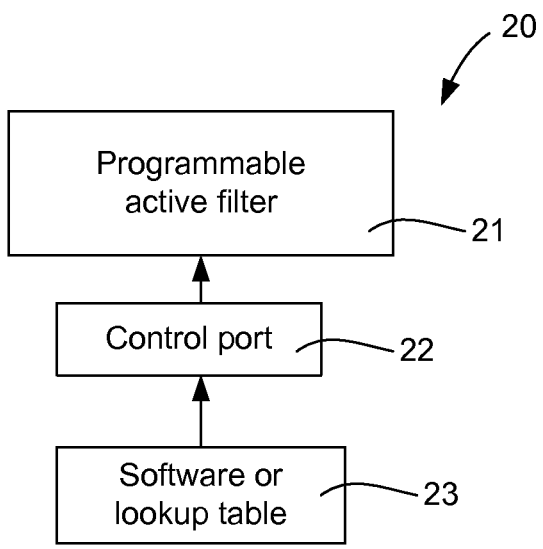
FIG. 2 is a simplified block diagram of a programmable filter according to an embodiment of the present invention.

FIG. 2 is a simplified block diagram of a programmable frequency-selective circuit 20 according to an embodiment of the present invention. This diagram is merely an example, which should not unduly limit the scope of the claims recited herein. One of ordinary skill in the art would recognize other variations, modifications, and alternatives. Programmable frequency-selective circuit 20 may include a programmable active filter 21 as shown in FIG. 1A having a cut-off frequency that is a function of gain, bandwidth, and process parameters. In an embodiment, programmable active filter 21 may include the configuration of FIG. 1C. It is appreciated that the present invention is not limited to RC filters. Programmable filter 20 further includes a control port coupled to the programmable active filter. In addition, programmable filter 20 may include a memory storing a software program that allows a user to modify the gain, bandwidth and the process resolution. In an embodiment, the memory may include a look-up table that allows the user to vary a bandwidth within a bandwidth range, program a gain in a number of steps in dB, and set a process resolution within a predetermined accuracy range. By way of example, and not limitation, the look-up table may include RAM, ROM, EEPROM or any other medium that can be used to store desired parameters. In an embodiment, the look-up table can be accessed by a special-purpose or general-purpose computer.

In some applications, the bandwidth of an RC filter may vary. In an exemplary embodiment, the bandwidth of a RC low-pass filter may be set between two modes, namely 6 MHz for NTSC systems or 8 MHz for Pal/SECAM systems. It is an advantage of the present invention to provide an RC filter having a selectable bandwidth, gain and process tuning In the description below, exemplary embodiments assume that the bandwidth of the low-pass filter can be set between a 6 MHz mode and an 8 MHz mode, the gain can be programmed in a 3-dB step, and the process tuning is programmed in three steps having 5% resolution, namely −5%, 0, and +5%. This embodiment is merely an example, which should not unduly limit the scope of the claims recited herein. One of ordinary skill in the art would recognize other variations, modifications, and alternatives.

One technique leading to such scaling is as follows:
(i) provide scaled capacitance values of 1.000, and 0.750 to establish the bandwidth modes, (ii) for each bandwidth mode, further scale the capacitance by a factor of 1.000, and 0.707 to keep the bandwidth constant over gain programming; and (iii) for each bandwidth mode and gain step, provide four scaling steps of 0.840, 0.952, 1.000, and 1.053 for process tuning.

One way of adjusting the value of an integrated circuit capacitor is to provide an array in which a main capacitor having a smaller value than the nominal capacitance value and a number of smaller capacitors that are connected in parallel to the main capacitor based on a target capacitor value. This approach may have the significant disadvantage that requires an exact capacitor scaling operation, which add significantly to the cost of the active filter.

Exact scaling may require an array of irregularly sized capacitors. The lack of regular structure in the capacitor array may result in poorly utilized layout area (white space). This approach is not flexible if the gain steps or bandwidth increments are changed because the layout of the entire cap array is impacted.

Figure 3:
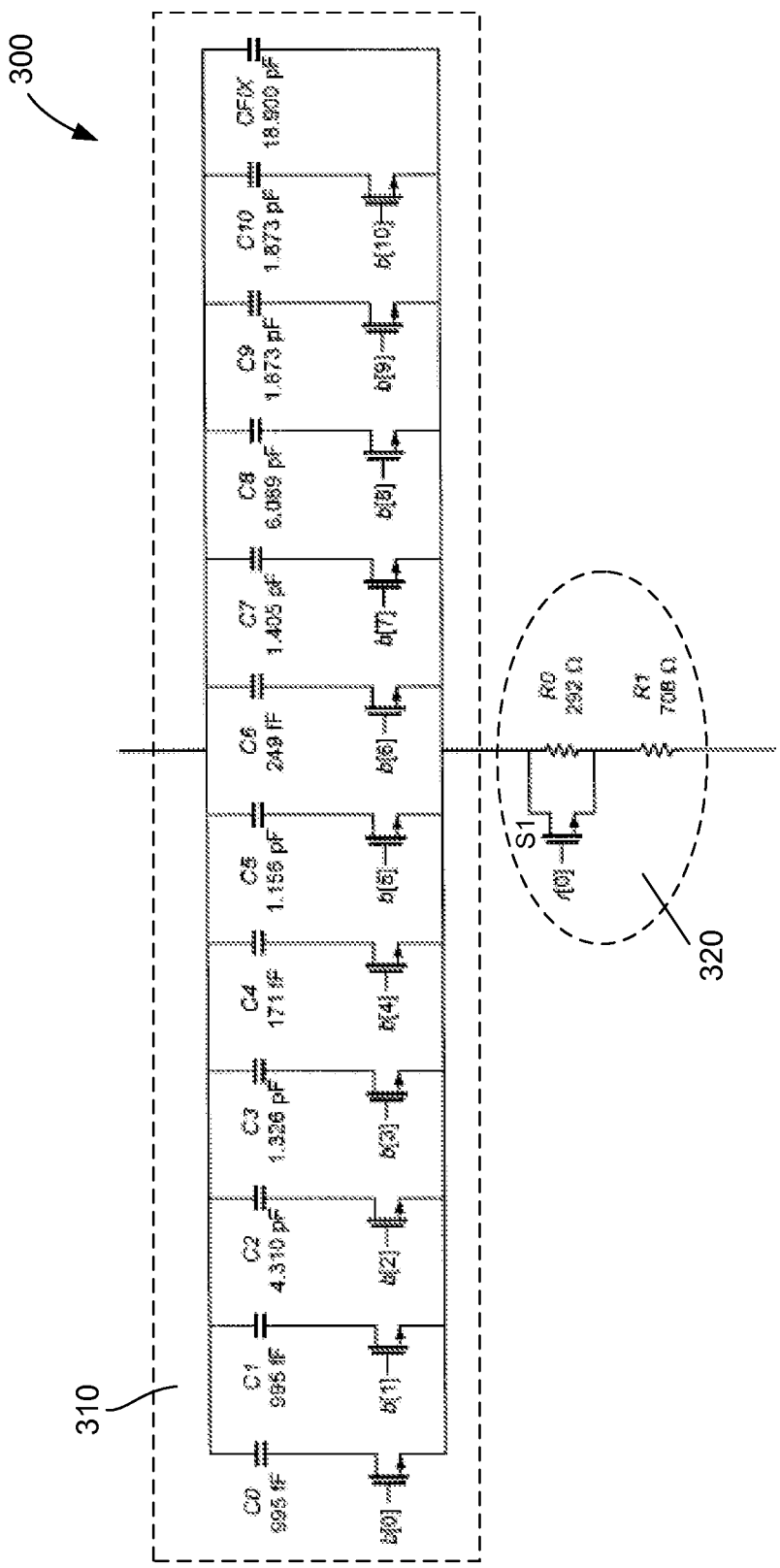
FIG. 3 is a schematic of an exact scaling of capacitance values for filter tuning according to an embodiment of the present invention.

FIG. 3 is a schematic of an exact scaling circuit 300 of capacitance values for filter tuning according to an embodiment of the present invention. Exact scaling circuit 300 includes a capacitor array 310 coupled to a resistor array 320. In an embodiment, capacitor 310 may correspond to capacitor C1a in the feedback path 112 and resistor array 320 may correspond to resistor Rp as shown in FIG. 1C. Capacitor array 310 includes a capacitor CFIX and 11 capacitors C0 to C10, each of the 11 capacitors is connected in parallel to capacitor CFIX through a respective switch. In the example embodiment, the switch may be a MOS transistor. Each MOS transistor is turned on and off by a corresponding control bit (b(0) to b(10)). Resistor array 320 includes a resistor R0 that is connected to a resistor R1 in series. A transistor S1 is connected across resistor R0 to short-circuit resistor R0 under a control bit r(0). In an embodiment, the control bits for the capacitor array and the resistor array are generated by control port 22 of FIG. 2.

Figure 4:
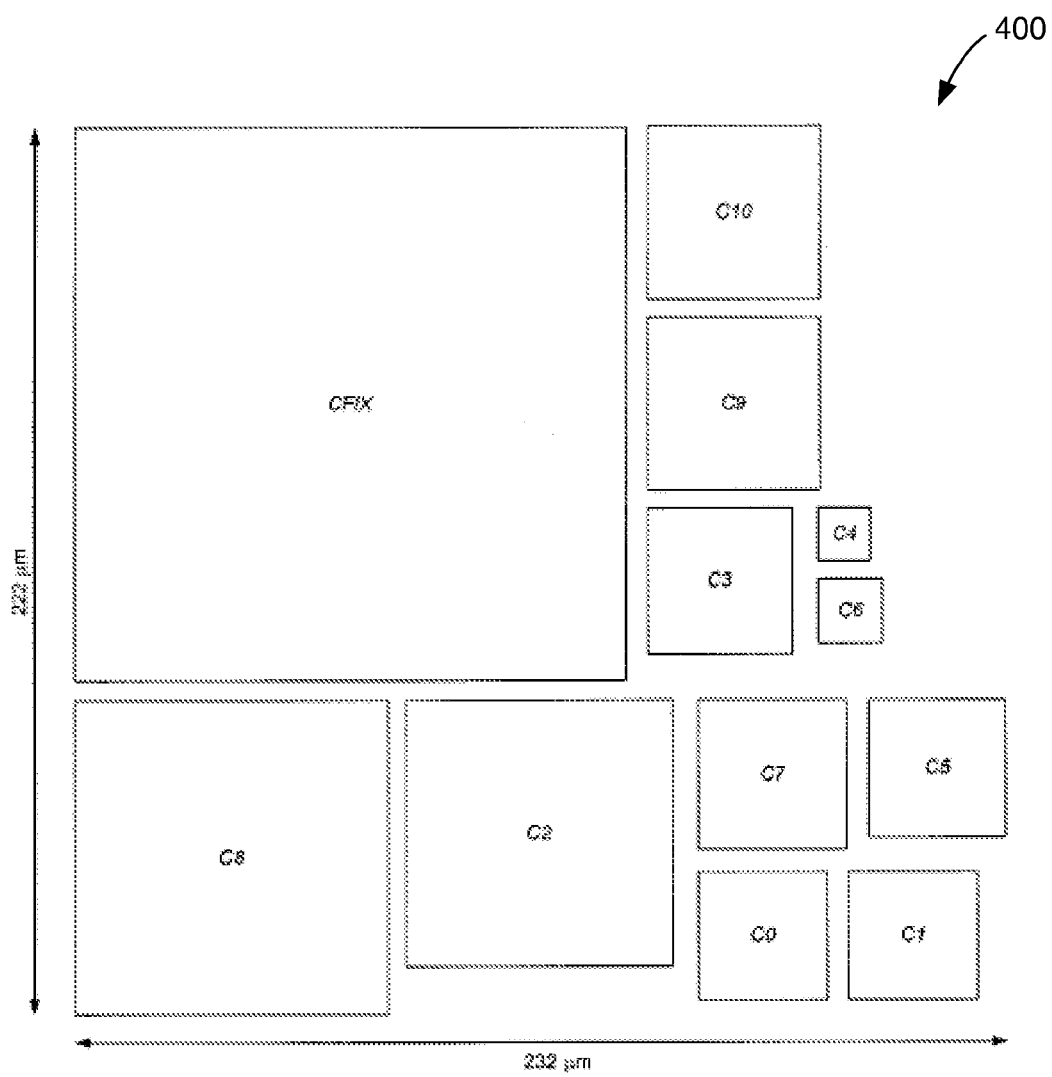
FIG. 4 is a capacitor layout 400 of the exact scaling of capacitance values of FIG. 3.

FIG. 4 is an example capacitor layout 400 of the exact scaling approach of FIG. 3. In the example shown, the die area for the capacitor array is 0.052 mm$^2$, providing a capacitor density of about 1 fF/μm$^2$.

Figure 7:
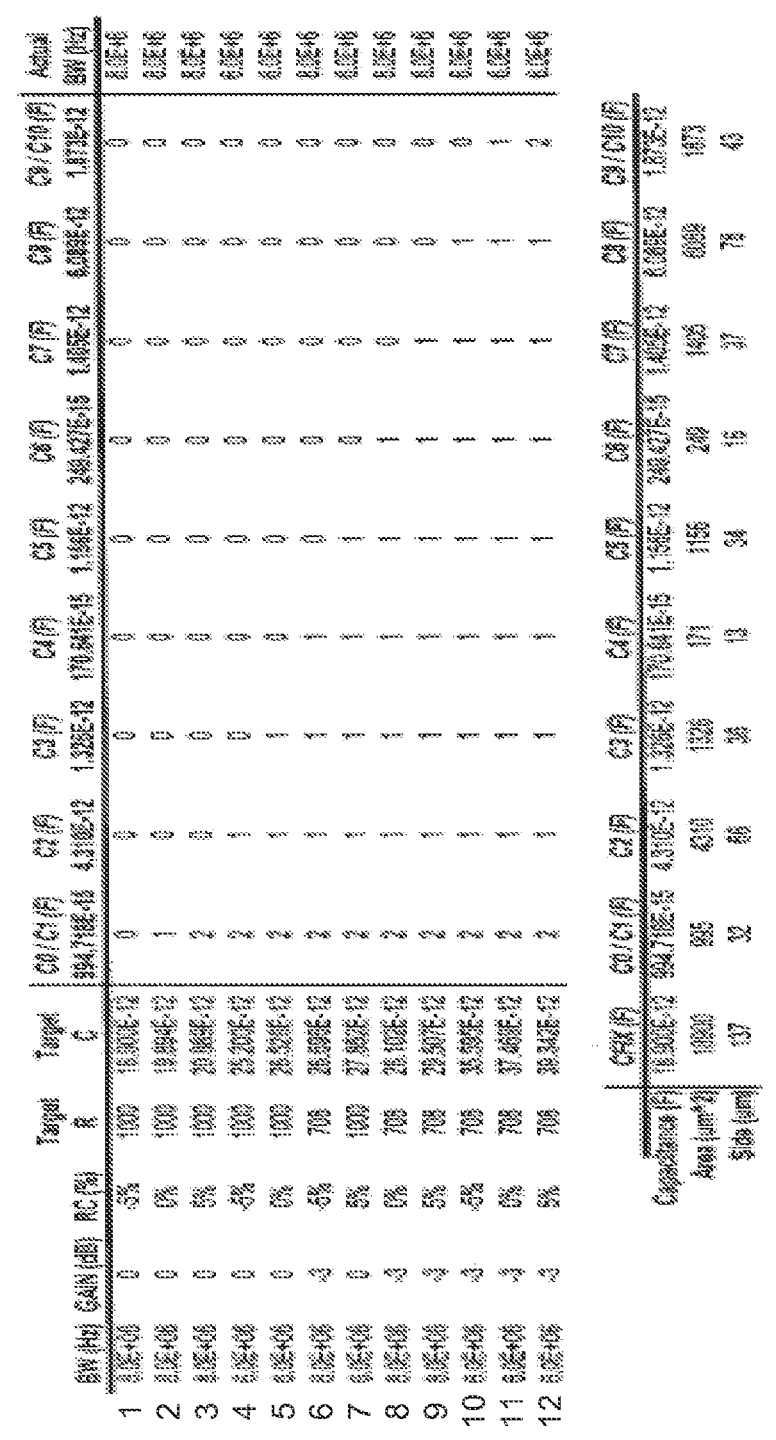

The table shown in FIG. 7 illustrates an exact scaling of capacitance values as a function of bandwidth, gain, and process tuning and required capacitance values of FIG. 3. Row 1 shows that a bandwidth of 8 MHz, gain of 0 dB and process tuning of −5% can be obtained when the resistor array has a value of 1000Ω and the capacitor array has a value of 18.9 pF. That is, the switches (or transistors) of the capacitors C0 to C10 and the switch S1 of resistor R0 are all turned off. Row 12 (the last row) shows that a bandwidth of 6 MHz, a gain of −3 dB, a processing tuning of +5% can be obtained when the resistor array has a value of 708Ω and the capacitor array has a value of 39.34 pF. That is, all switches of the capacitors C0 to C10 including switch S1 of resistor R0 are turned on. Rows 2 to 11 show various other combinations for the different bandwidths, gains, and process tunings.

Figure 8:
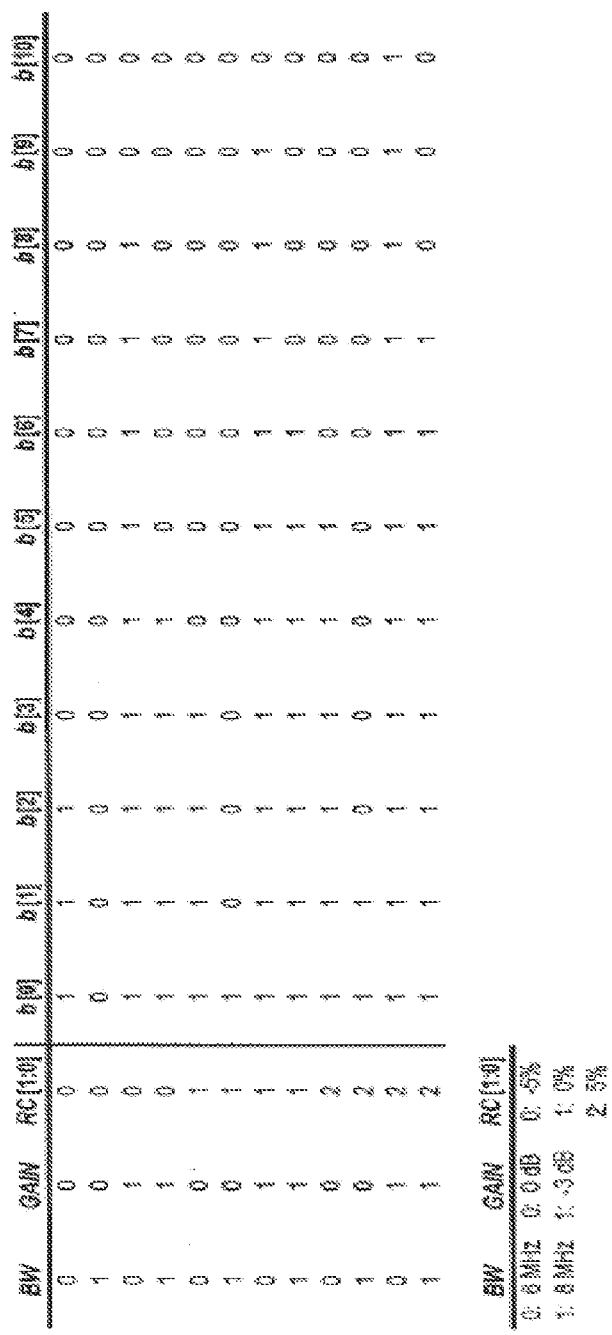
FIG. 8 shows a truth table for the exact scaling capacitor selection according to an embodiment of the present invention.

FIG. 8 shows a truth table illustrating an example embodiment using the exact scaling approach of FIG. 3. FIG. 8 provides the programmed switch positions for the combinations of the bandwidth, gain, and process tuning.

In accordance with one embodiment of the present invention, the total scaled capacitance value can be quantized to a given least significant bit (LSB) size, chosen based on overall precision required. The programmable capacitor C(n) is then implemented as a fixed capacitance value (determined by $C_{min}$) and a unit-weighted capacitance array ranging from $C_{min}$ to $C_{max}$ in steps of $C_{LSB}$, as shown in the expression (1) below:

$$C(n)=C_{min}+nC_{LSB} \quad (1)$$

The selection function can be implemented as a logic function, in a hardware lookup table, or in software as, for example:

$$n=Q(g(\text{GAIN},\text{BW},\text{RCTUNE})) \quad (2)$$

where g(•) defines a mapping from each independent variable to the desired capacitance, and Q(•) is a quantizing function. Digital CMOS fabrication processes facilitate the area-efficient implementation of complex tuning functions. Thus, the quantized scaling approach results in area savings because the complexity is transferred from the capacitor array itself to the selection function.

Figure 5:
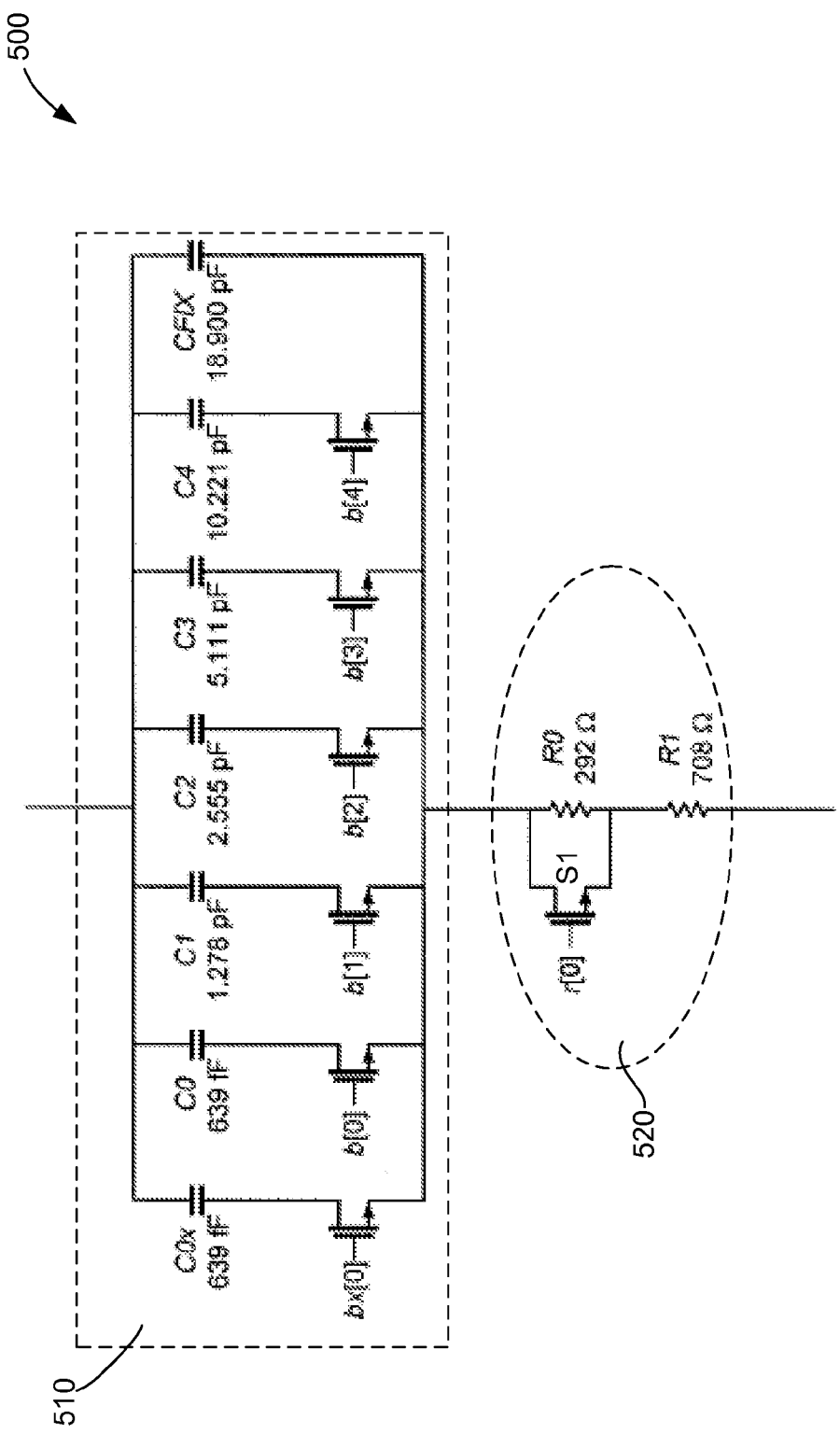
FIG. 5 is an exemplary schematic of a fixed-plus-binary capacitor array implementation of capacitance values for filter tuning according to an embodiment of the present invention.

FIG. 5 is an exemplary schematic of a fixed-plus-binary capacitor array implementation 500 of capacitance values for filter tuning according to an embodiment of the present invention. Fixed-plus-binary capacitor array implementation 500 includes a capacitor array 510 coupled to a resistor array 520. In an embodiment, capacitor 510 may correspond to capacitor C1a in the feedback path 112 and resistor array 520 may correspond to resistor Rp of FIG. 1C. Capacitor array 510 includes a capacitor CFIX and six capacitors C0x, C0 to C4, each of the six capacitors is connected in parallel to capacitor CFIX through a respective switch. In an example embodiment, the switches may be a MOS transistor. Each MOS transistor is turned on and off by a corresponding control (bit bx(0), b(0) to b(4)). In an embodiment, the value of the switchable capacitor is binary-weighted. In an exemplary embodiment, capacitor C0x and C0 may have an identical value, and capacitor C1 has a value that is twice the value of C0, C2 has a value that is twice the value of C1, C3 has a value that is twice the value of C2, and C3 has a value that is twice the value of C3.

Resistor array 520 includes a resistor R0 that is connected to a resistor R1 in series. A transistor S1 is connected across resistor R0 to short-circuit resistor R0 under a control bit r(0). In an embodiment, the control bits for the capacitor array and the resistor array are generated by control port 22 of FIG. 2.

In an exemplary embodiment, an 18.9-pF fixed capacitor is used with a 5-bit capacitor array having a 639-fF LSB. The fixed capacitor is defined by the minimum capacitance required for all inputs. The number of bits and LSB size is then determined by the required precision and span.

Figure 9:
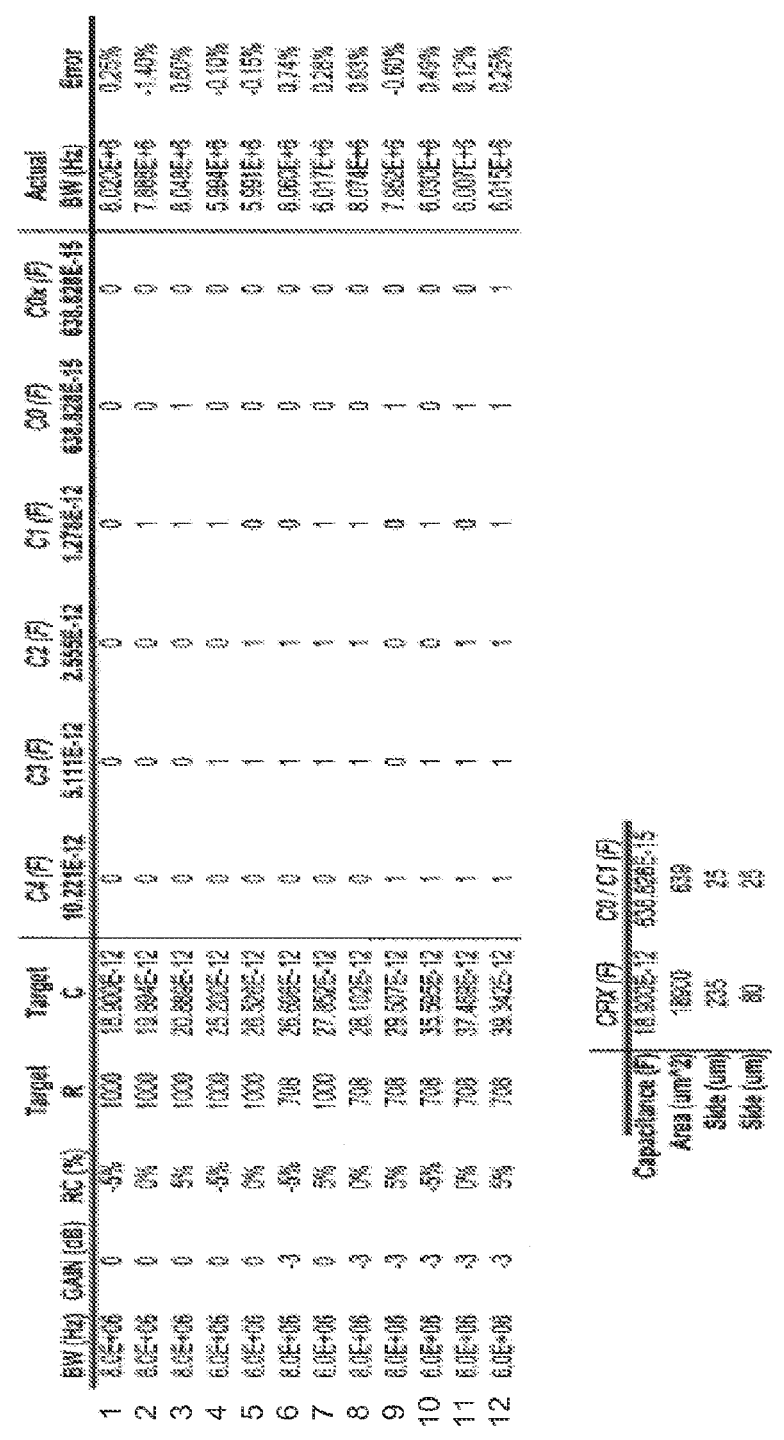

The table in FIG. 9 shows the derivation of the quantized scaling function of FIG. 5 according to an embodiment of the present invention. Row 1 shows that a bandwidth of 8 MHz, a gain of 0 dB and a process tuning of −5% can be obtained when the resistor array has a value of 1000Ω and the capacitor array has a value of 18.9 pF. That is, the switches (or transistors) of the capacitors C0x, C0 to C4 and the switch S1 of resistor R0 are all turned off. Row 12 (the last row) shows that a bandwidth of 6 MHz, a gain of −3 dB, a processing tuning of +5% can be obtained when the resistor array has a value of 708Ω and the capacitor array has a value of 39.34 pF. That is, all switches of the capacitors C0x, C0 to C4 and switch S1 of resistor R0 are turned on. Rows 2 to 11 show other combinations for various bandwidths, gains, and process tunings.

Figure 10:
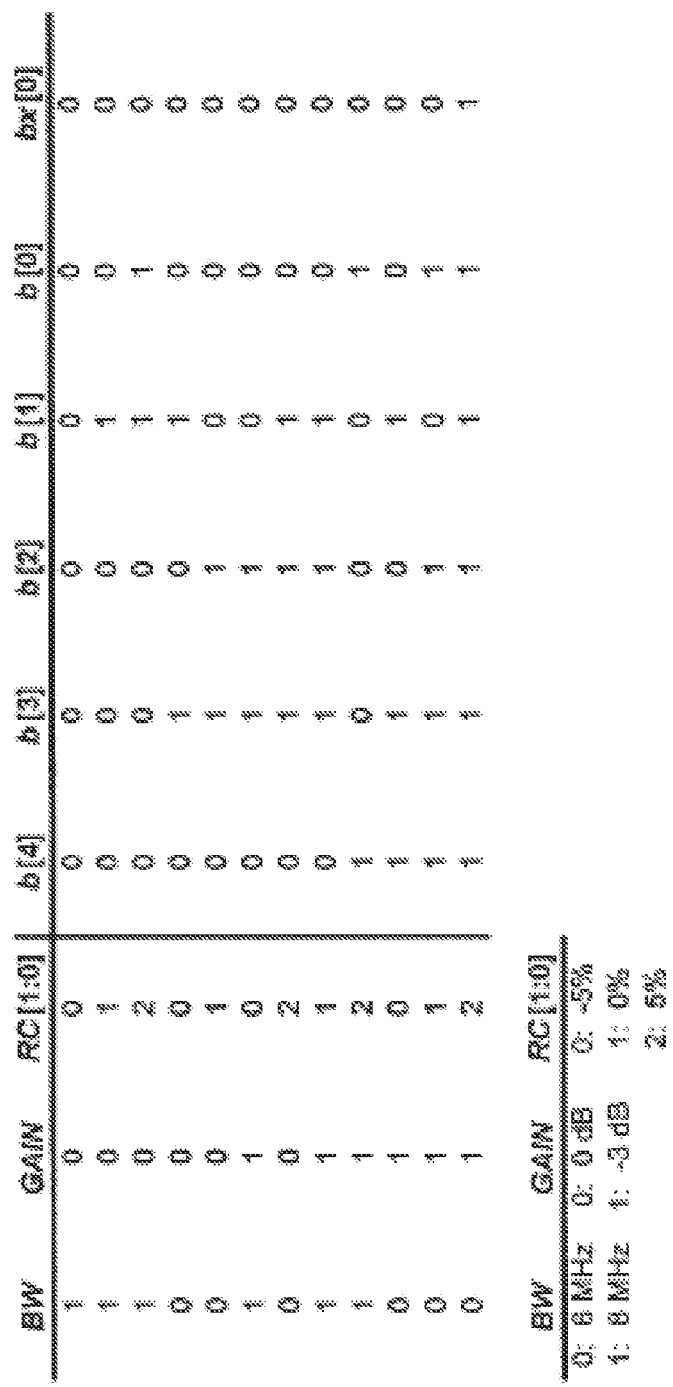
FIG. 10 shows a truth table for the quantized scaling function according to an embodiment of the present invention.

FIG. 10 shows a truth table 400 illustrating an example embodiment using the fixed-plus-binary array approach according to an embodiment of the present invention. FIG. 10 provides the programmed switch positions for the various combinations of the bandwidth, gain, and process tunings.

Figure 6:
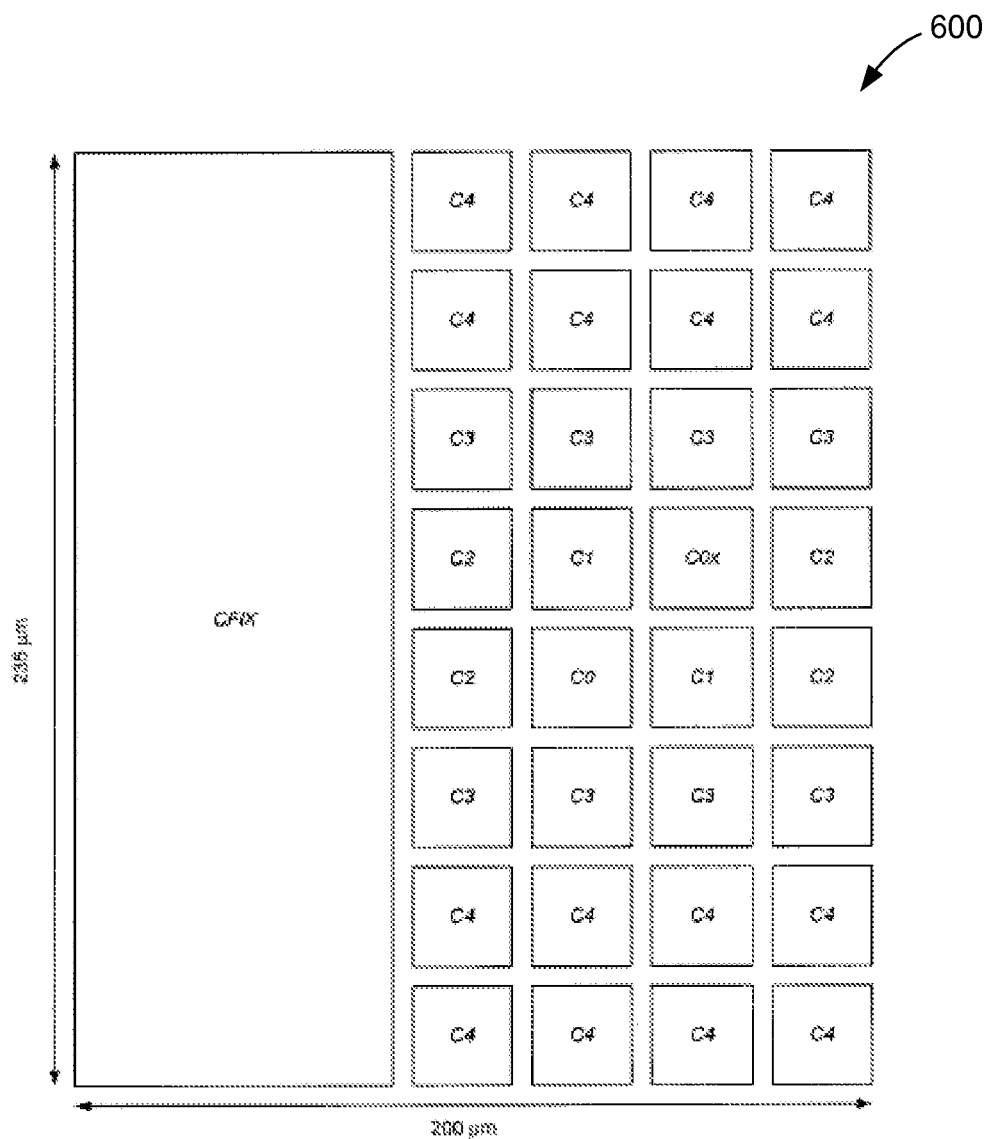
FIG. 6 is a capacitor layout with a quantized scaling scheme for the fixed-plus-binary capacitor array implementation of FIG. 4.

FIG. 6 is an example capacitor layout 600 of the fixed-plus-binary array approach of FIG. 5. In the example shown, the die area for the capacitor array is 0.047 mm², resulting in an area savings of about 10 percent comparing with the exact scaling approach of FIG. 3. The use of a fixed capacitor combined with a binary-weighted capacitor array enables a regular and hence more efficient layout. Although the regular layout using the fixed-plus-binary array approach results in a quantization error of the capacitor step of −1.4% (see last column of the table shown in FIG. 9), the approach is still advantageous because the process tuning only has a resolution of 5%. Furthermore, the regular array allows a common centroid layout for the capacitor array, and all elements can be designed to have the same perimeter-to-area ratio for better matching.

Although the exemplary implementation described above relates to a low-pass RC active filter, one of skilled in the art would appreciated that the implantation could be applied to band-pass and high-pass filters by changing the location of the capacitor in the feedback path.

Embodiments of the present invention are described using a single-ended operational mode. Preferred embodiments of the present invention include differential operational amplifiers and perform differential operations.

Many alternatives, modifications, and variations will be apparent to those skilled in the art in light of the above teachings. For example, the filter according to embodiments of the present invention may allow the bandwidth selection characteristics to be changed in the following manner as necessary. For example, the resistor Rfa (Rfb) in the feedback path 112 (113) of FIG. 1C may also be made programmable.

It is understood that the above embodiments of the present invention are illustrative and not limiting. Various alternatives and equivalents are possible. For example, the invention may be applied to other active filter topology such as Sallen-Key, gm-C. The invention is also not limited by the type of integrated circuits in which the present disclosure may be disposed. Other additions, subtractions or modifications are obvious in view of the present invention and are intended to fall within the scope of the appended claims.

What is claimed is:

1. A programmable active frequency-selective circuit comprising:
    a first capacitor having a fixed value; and
    a second capacitor coupled in parallel with the first capacitor and comprising a plurality of switchable capacitors coupled in parallel to each other;
    a lookup table associated with the second capacitor and configured to determine a capacitance value;
    a plurality of switches, each of the plurality of switches being associated with a different one of the plurality of switchable capacitors;
    a control port configured to control the plurality of switches to achieve the capacitance value using the lookup table; and
    a memory coupled to the control port and configured to store the look-up table, wherein the look-up table comprises data associated with gain, bandwidth, and process variations.

2. The programmable active frequency-selective circuit of claim 1 further comprising a memory coupled to the control port and configured to store a software program adapted to program the value of the second capacitor.

3. The programmable active frequency-selective circuit of claim 1 wherein the bandwidth mode is selectable between a first bandwidth and a second bandwidth.

4. The programmable active frequency-selective circuit of claim 1 wherein the gain is programmable between a first gain and a second gain.

5. The programmable active frequency-selective circuit of claim 1 further comprising:
    a first resistor having a fixed first value;
    a second resistor coupled in series with the first resistor; and
    a switch coupled across the second resistor;
    wherein the switch is controlled by the control port to short-circuit the second resistor to change a gain of the programmable active frequency-selective circuit.

6. The programmable active frequency-selective circuit of claim 1, wherein the look-up table is accessed by a computer.

7. The programmable active frequency-selective circuit of claim 1, wherein the second capacitor has a common centroid layout and each of the switchable capacitors has a same perimeter-to-area ratio.

8. The programmable active frequency-selective circuit of claim 1, wherein the plurality of switchable capacitors are binary-weighted.

9. A control circuit of a resistor-capacitor (RC) filter, the control circuit comprising:
    a first resistor having a first value;
    a second resistor connected in series with the first resistor, the second resistor having a second value;
    a third resistor having a third value and coupled to the second resistor;
    a fixed capacitor coupled across the third resistor;
    a capacitor array having a plurality of switchable capacitors arranged in parallel and being coupled across the fixed capacitor and across the third resistor;
    a lookup table associated with the capacitor array and configured to determine a capacitance value;
    an array of switches, each of the switches being associated with a different one of the switchable capacitors;
    a control port coupled to the array of switches; and
    a memory coupled to the control port and configured to store the look-up table comprising data associated with bandwidth, gain, and process variations.

10. The control circuit of claim 9, further comprising a memory coupled to the control port and configured to store a software program adapted to program the capacitance value of the capacitor array.

11. The control circuit of claim 9 wherein the memory comprises a RAM, a ROM, or an EEPROM.

12. The control circuit of claim 9, wherein the first, second and third values of the respective first, second, and third resistors are fixed.

13. The control circuit of claim 9 further comprising a switch coupled across the second resistor, wherein the switch is configured to short-circuit the second resistor to change the gain of the RC filter.

14. The control circuit of claim 9, wherein the RC filter is an active low-pass filter having a differential input and a differential output.

15. The control circuit of claim 9, wherein the capacitor array is binary-weighted.

16. The control circuit of claim 9, wherein the RC filter comprises an operational amplifier, the operational amplifier comprising:
    an input terminal coupled to the second resistor;
    an output terminal coupled to the third resistor;
    wherein the fixed capacitor and the capacitor array are coupled across the input terminal and the output terminal.

17. The control circuit of claim 9, wherein the capacitor array has a common centroid layout and each of the switchable capacitors has a same perimeter-to-area ratio.

* * * * *